United States Patent
Louco et al.

(10) Patent No.: US 10,462,937 B1
(45) Date of Patent: Oct. 29, 2019

(54) PCB DESIGN FOR ELECTRICALLY-ACTUATED TURBOCHARGERS

(71) Applicant: BorgWarner, Inc., Auburn Hills, MI (US)

(72) Inventors: Lathom Louco, Arden, NC (US); Jeffrey Carter, Mirfield (GB)

(73) Assignee: BorgWarner, Inc., Auburn Hills, MI (US)

( * ) Notice: Subject to any disclaimer, the term of this patent is extended or adjusted under 35 U.S.C. 154(b) by 0 days.

(21) Appl. No.: 16/381,476

(22) Filed: Apr. 11, 2019

(51) Int. Cl.
| | |
|---|---|
| *F02B 37/12* | (2006.01) |
| *H05K 7/20* | (2006.01) |
| *H05K 1/18* | (2006.01) |
| *H05K 1/02* | (2006.01) |

(52) U.S. Cl.
CPC .............. *H05K 7/209* (2013.01); *F02B 37/12* (2013.01); *H05K 1/0209* (2013.01); *H05K 1/183* (2013.01); *H05K 2201/10166* (2013.01)

(58) Field of Classification Search
USPC .................................................. 361/760, 761
See application file for complete search history.

(56) References Cited

U.S. PATENT DOCUMENTS

| | | | |
|---|---|---|---|
| 8,201,324 B2 | 6/2012 | Kim et al. | |
| 9,559,047 B2 | 1/2017 | Standing et al. | |
| 9,698,130 B2 | 7/2017 | Weis et al. | |
| 9,974,187 B2 | 5/2018 | Standing et al. | |
| 2009/0042336 A1 | 2/2009 | Paik et al. | |
| 2014/0254101 A1 | 9/2014 | Carter et al. | |
| 2014/0268628 A1* | 9/2014 | Mann | G08C 17/00 362/23.1 |
| 2016/0079156 A1 | 3/2016 | Liu et al. | |
| 2018/0206305 A1* | 7/2018 | Van Winkle | F21S 8/026 |

\* cited by examiner

*Primary Examiner* — Andargie M Aychillhum
(74) *Attorney, Agent, or Firm* — Reising Ethington, PC

(57) ABSTRACT

A printed circuit board (PCB), including electrical components for controlling electrically-actuated turbochargers, having a switching device configured to be electrically connected to an electrical power source and electrically connected to an electric motor of an electrically-actuated turbocharger, wherein the switching device is physically attached to a side of the PCB within a cavity formed in the side of the PCB such that at least a portion of the switching device is below the side of the PCB.

20 Claims, 5 Drawing Sheets

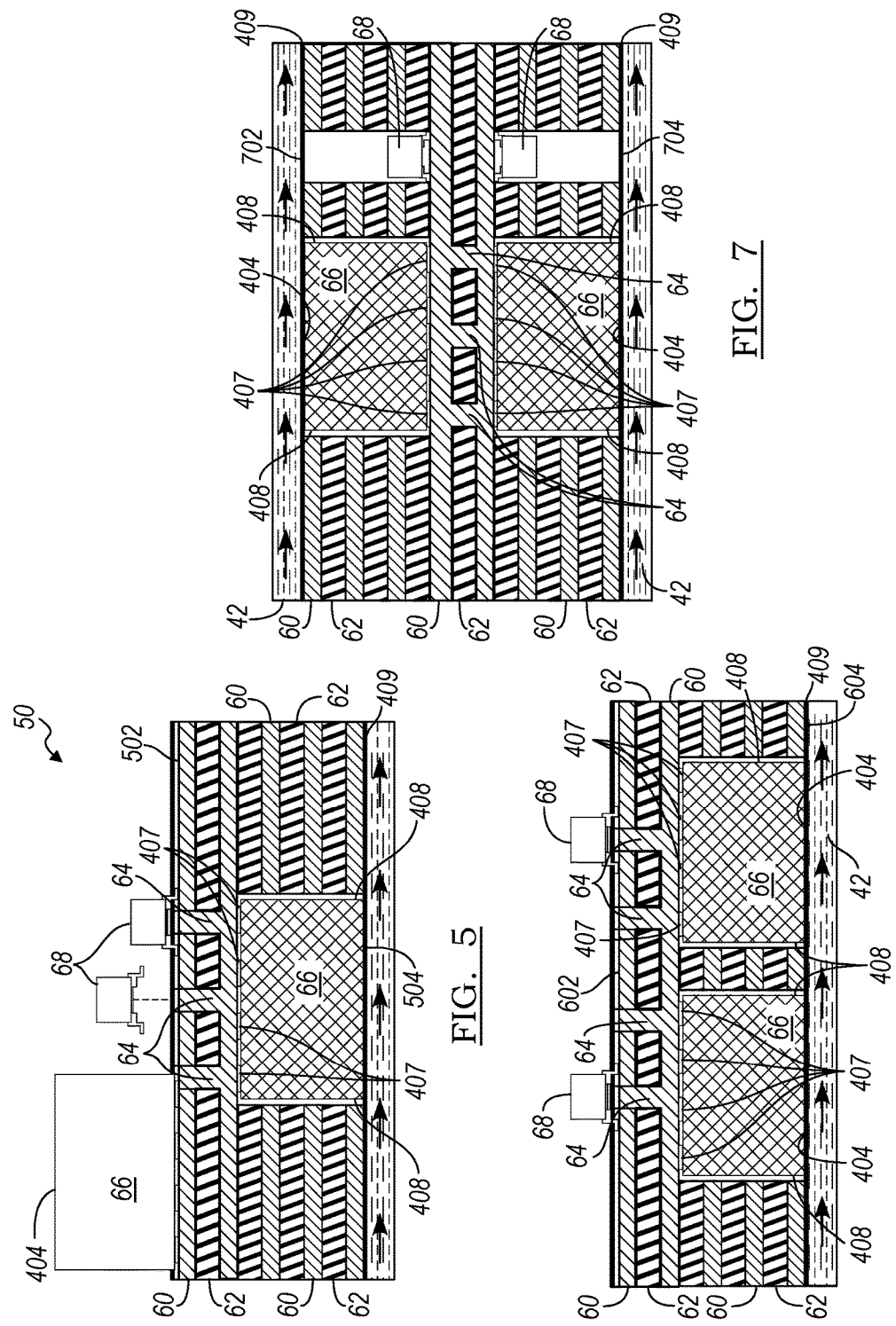

PCB DESIGN FOR ELECTRICALLY-ACTUATED TURBOCHARGERS

TECHNICAL FIELD

The present application relates to printed circuit boards (PCBs) and, more particularly, to the positioning of electrical components on the PCBs.

BACKGROUND

Internal combustion engines (ICEs) rely on the combination of fuel, spark, and an intake of ambient air to create a combustion event that repeatedly moves pistons in a way to forcibly rotate a crankshaft. Fuel and spark is introduced into a combustion chamber at one end of a cylinder within which the piston moves reciprocatively. As fuel and spark are delivered to the combustion chamber in the presence of ambient air, combustion occurs and forces the piston away from the combustion chamber thereby converting that force into rotational energy through the crankshaft. The power of an ICE can be increased for a given quantity of fuel and spark using the forced induction of ambient air into the combustion chambers via turbochargers as is known. In the past, turbochargers included an exhaust turbine and compressor turbine that were mechanically linked via a common shaft. Turbochargers receive exhaust gas from the ICE that rotates the exhaust turbine, which transmits that rotation to the compression turbine compressing air ultimately introduced to the intake of the ICE.

Turbochargers successfully compress air that is introduced to the intake of the ICE, but effective levels of compressed air may only be generated at elevated revolution-per-minute (RPM) levels of crankshaft rotation. It would be helpful to introduce compressed air into the intake of the ICE even when the ICE is operating at relatively low RPM levels. Turbochargers can be equipped with electric motors that are coupled to the compressor turbine and are able to rotate the turbine across a range of throttle positions for the ICE—even at lower RPM levels. However, the inclusion of electric motors with a turbocharger involves additional challenges that may not exist for non-electrically-actuated turbochargers. For example, the electric motors can be controlled by electrical components that are sensitive to heat. Yet turbochargers often operate in a high-heat environment. Moving the electrical components away from the turbocharger and connecting them to the electrical motor can help keep them cool but this increases cost and complexity. Keeping the electrical components simultaneously cool and nearby the turbocharger can be challenging. Further, the orientation of electrical components relative to each other on the PCB can consume significant area on the PCB and also affects performance of the electric motor of the turbo. It would be helpful to orient the electrical components to minimize space consumption and increase electric motor responsiveness.

SUMMARY

In one implementation, a printed circuit board (PCB), including electrical components for controlling electrically-actuated turbochargers, has a switching device configured to be electrically connected to an electrical power source and electrically connected to an electric motor of an electrically-actuated turbocharger, wherein the switching device is physically attached to a side of the PCB within a cavity formed in the side of the PCB such that at least a portion of the switching device is below the side of the PCB.

In another implementation, a PCB, including electrical components for controlling electrically-actuated turbochargers, has a first switching device configured to be electrically connected to an electrical power source and electrically connected to an electric motor of an electrically-actuated turbocharger, wherein the switching device is physically attached to a first side of the PCB; a second switching device configured to be electrically connected to the electrical power source and electrically connected to the electric motor of the electrically-actuated turbocharger, wherein the switching device is physically attached to a second side of the PCB within a cavity formed in a second side of the PCB such that at least a portion of the second switching device is below the second side of the PCB.

In yet another implementation, a PCB, including electrical components for controlling electrically-actuated turbochargers, has a first switching device configured to be electrically connected to an electrical power source and electrically connected to an electric motor of an electrically-actuated turbocharger, wherein the switching device is physically attached to a first side of the PCB within a first cavity formed in the first side of the PCB such that at least a portion of the first switching device is below the first side of the PCB; and a second switching device configured to be electrically connected to the electrical power source and electrically connected to the electric motor of the electrically-actuated turbocharger, wherein the switching device is physically attached to the first side of the PCB within a second cavity formed in the first side of the PCB such that at least a portion of the second switching device is below the first surface of the PCB.

BRIEF DESCRIPTION OF THE DRAWINGS

FIG. 5 is a cross-sectional view depicting another implementation of a PCB used with an electrically-actuated turbocharger assembly;

FIG. 6 is a cross-sectional view depicting another implementation of a PCB used with an electrically-actuated turbocharger assembly; and FIG. 7 is a cross-sectional view depicting another implementation of a PCB used with an electrically-actuated turbocharger assembly.

DETAILED DESCRIPTION

Figure 1:
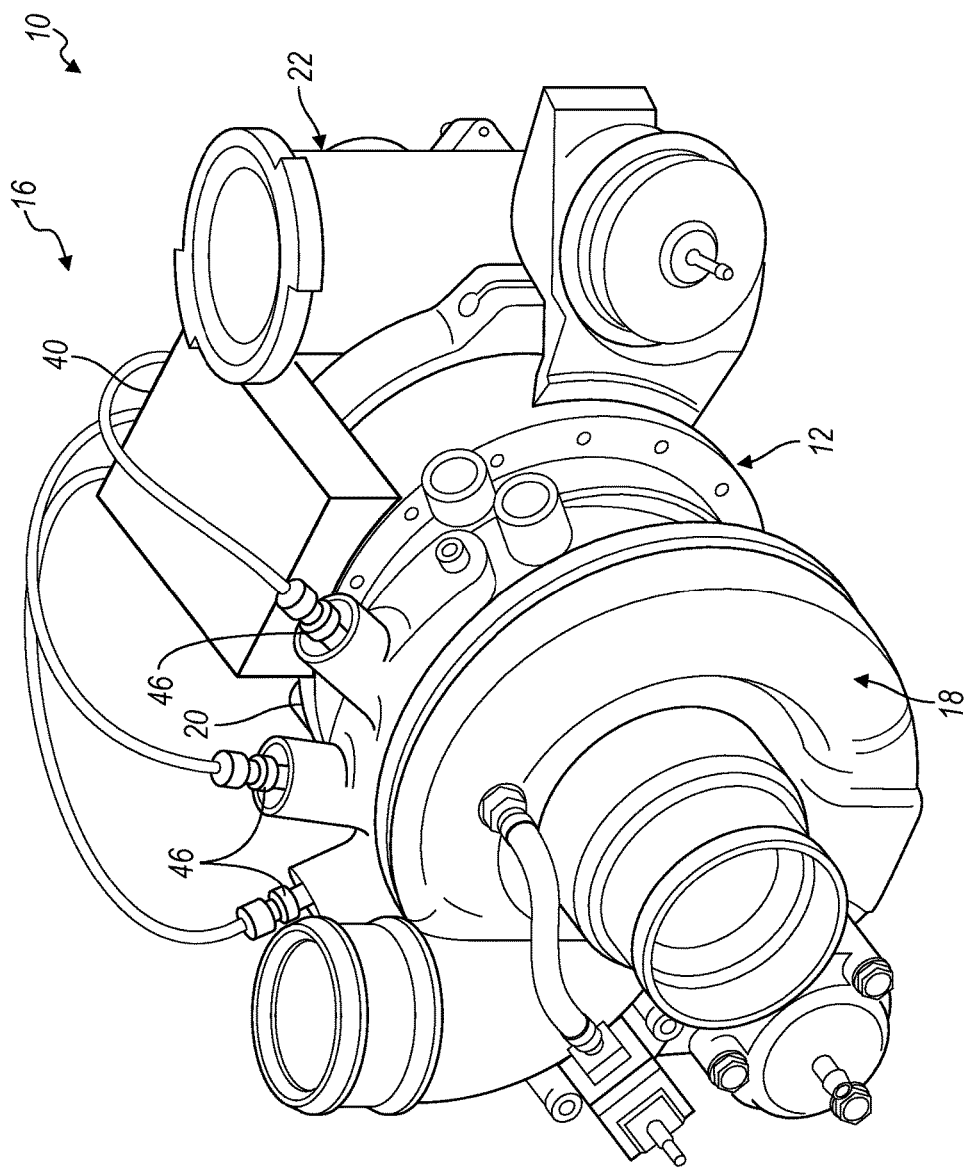
FIG. 1 is a perspective view depicting an implementation of an electrically-actuated turbocharger assembly.

Different implementations of electrical devices can benefit from application-specific printed circuit board (PCB) designs. That is, the performance needs of a particular electric device such as an electrically actuated turbocharger, can be optimized by specifically configuring a PCB. More specifically, a PCB can be configured to control an electric motor used with the electrically-actuated turbocharger. The location of electrical components on the PCB and the manner in which the electrical components are mounted and electrically connected on the PCB can improve circuit performance when the PCB is used with the electric motor of the electrically-actuated turbocharger. Electrical components, such as a gate driver and a switching device, can be combined to regulate the delivery of electrical power to the electric motor of the electrically-actuated turbocharger. A number of application-specific challenges exist with PCBs used to control electrically-actuated turbochargers. In the past, PCBs were spaced apart from the electrically-actuated turbocharger and connected to the turbocharger by a length of electric cable. However, the length of cable added cost to the assembly and decreased the responsiveness of the electric motor to electrical power regulated by the PCB. It is helpful to position the PCB in close proximity to the electrically-actuated turbocharger, such as mounting the PCB within a housing mounted directly to the turbocharger, thereby eliminating the length of cable and increasing the responsiveness due to the decreased distance between electrical source and electric motor. But heat generated by the electrically-actuated turbocharger and/or the internal combustion engine (ICE) used with the turbocharger can make such an implementation challenging.

Performance improvements and responsiveness can be realized by carefully orienting the electrical components relative to each other and the PCB. For instance, cooling of the PCB can be facilitated by mounting the electrical components flush with one or both sides of the PCB. The switching device(s), the gate driver(s), or both can be recessed into the PCB such that a top surface of the electrical component is flush or substantially flush with a surface of a side of the PCB. Such an arrangement can create a surface of a side of the PCB that may be placed in direct contact with a heat sink facilitating the removal of heat from the PCB thereby reducing the temperature of the electrical components. Rather than a PCB that is positioned in a housing and separated from a cooling loop or heat sink by an air gap, the direct contact of the PCB to the heat sink can increase the efficiency with which the heat sink removes heat from the PCB and its electrical components. In the past, a surface of the heat sink has been contoured to conform with electrical components that are not recessed into the PCB, the contoured surface may poorly contact the electrical components and at the same time increase manufacturing costs. It would be helpful if the surface of the PCB contacting the heat sink was substantially flat or planar such that the heat sink could exist as a similarly planar surface against which the PCB and flushly-mounted electrical components abutted. An electrically-isolating barrier, such as a layer of dielectric grease, could separate the surface of the PCB with the flush electrical components and the heat sink; the flat/planar surface can help ensure more even contact and adhesion of the dielectric grease between the heat sink and the PCB surface. The PCB can include copper pads that are recessed into a body of the PCB such that they are in electrical and thermal communication with one or more conductive layers of the PCB. The conductive layers can transmit electrical current between the electrical components and can also conduct heat from the electrical components to the copper pads.

Other performance improvements can be realized by mounting one or more switching devices, such as power switches, on and at least partially recessed into a side of the PCB and one or more gate drivers on the same or an opposite side of the PCB. A footprint of the switching device(s) at least partially coincides with or overlaps one of the gate driver(s) or another switching device as viewed vertically or along the Z-axis. In the past, switching device(s) and the gate driver controlling the switching device(s) were mounted on a common side of the PCB. In the present disclosure, an electrical connection from the gate driver(s) can travel at least partially in the Z-direction through the PCB. By positioning the gate driver(s) and the power switching devices or multiple power switching device(s) so that they overlap in the vertical or Z-direction the distance between the electrical components is minimized thereby minimizing the length of the electrical connection between the components. This can help minimize circuit inductance and unwanted spikes in current that could occur during switching transitions as well as assisting magnetic field cancellation. Another helpful outcome may be a compact packaging space that increases power density. The area of the xy-plane of the PCB consumed by the electrical components can be decreased when mounting electrical components on one side and an opposite side of the PCB and electrically connecting those components in the z-direction. The orientation of the electrical components on the PCB can particularly improve the performance of an electrically-actuated turbocharger.

Figure 2:
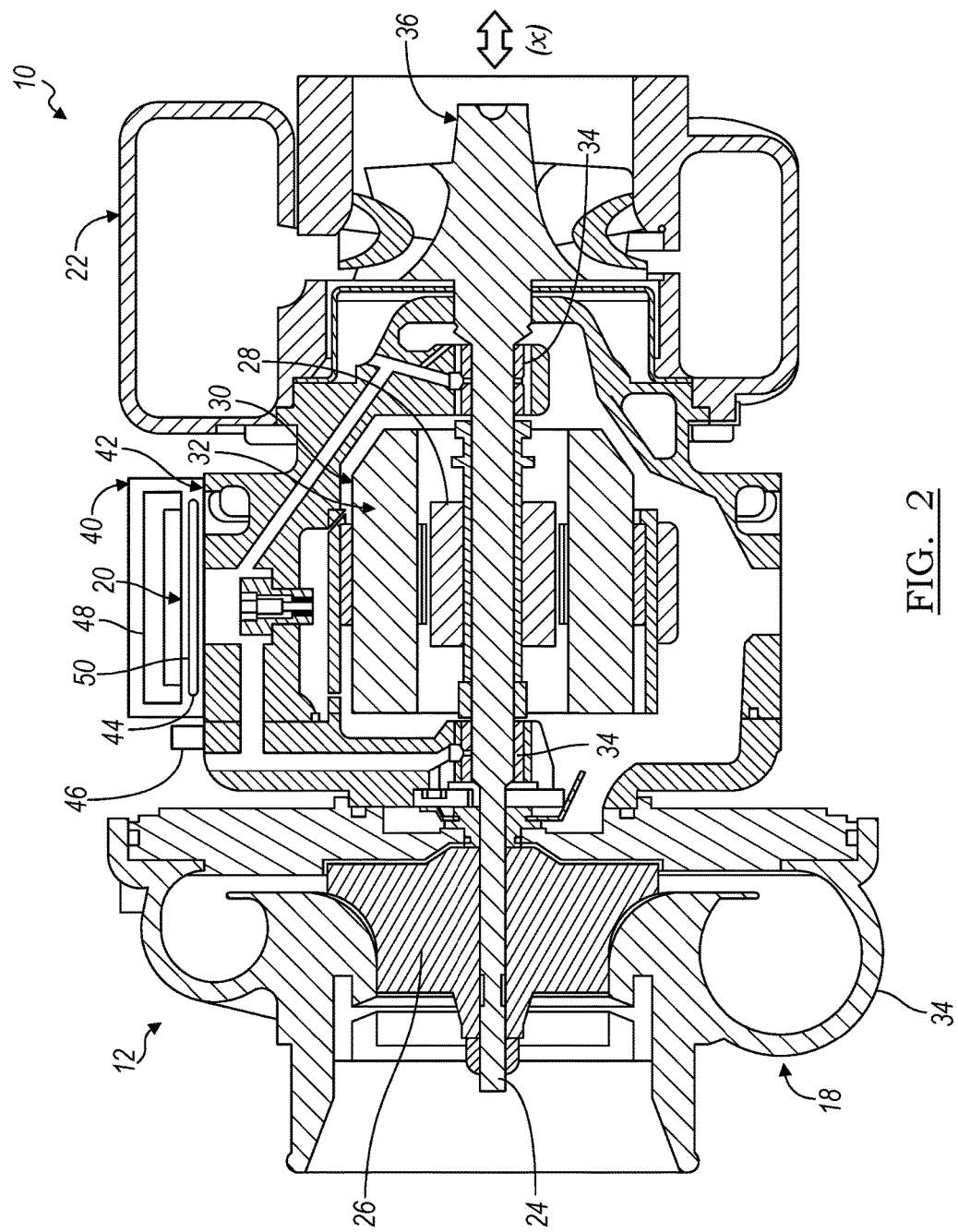
FIG. 2 is a cross-sectional view depicting an implementation of an electrically-actuated turbocharger assembly.

FIGS. 1-2 depict one implementation of an electrically-actuated turbocharger assembly 10 that includes an electrically-actuated turbocharger 12 and an electronics assembly 14 that includes a PCB received by a housing 16. The electrically-actuated turbocharger 12 includes a compressor portion 18, an electric motor portion 20, and an exhaust portion 22 that are assembled to form a structure that receives the components of the turbocharger 12. A turbine shaft 24 extends through the compressor portion 18, the electric motor portion 20, and the exhaust portion 20 as can be appreciated in FIG. 2. At one end, the turbine shaft 24 couples with a compressor turbine 26, located in the compressor portion 18, that spins to compress air, which is ultimately supplied to an intake plenum (not shown) of an internal combustion engine (ICE). Another portion of the turbine shaft 24 that is axially-spaced from the compressor turbine 26 and located in the electric motor portion 20 couples with a rotor assembly 28 of an electric motor 30. The rotor assembly 28 can be positioned concentrically relative to a stator 32 included in the electric motor portion 20. One or more bearings 34 are included in the electric motor portion 20 and axially spaced along the turbine shaft 24 to support and stabilize the turbine shaft 24, the compressor turbine 26, the rotor assembly 28, and an exhaust turbine 36 as these elements rotate within the turbocharger 12 during operation. The exhaust turbine 36 is coupled to an end of the turbine shaft 24 distal to the compressor turbine 26 located in the exhaust portion 22.

The compressor portion 18 includes a compressor turbine chamber 38 in which the compressor turbine 26 spins in response to the rotation of the turbine shaft 24 and compresses air that is ultimately supplied to the intake manifold of the ICE. The compressor turbine 26 is coupled with the turbine shaft 24 that extends from the compressor portion 18 into the electric motor portion 20 and the exhaust portion 22. The rotor assembly 28 is coupled to the turbine shaft 24 so that the rotor assembly 28 and the turbine shaft 24 are not angularly displaced relative to each other. When combined, the rotor assembly 28 extends axially relative to the shaft 22 in close proximity to the stator 32. The stator 32 can include a plurality of windings that convey electrical current from the power electronics and induce the angular displacement of the rotor assembly 28 and the turbine shaft 22 coupled to the rotor assembly 28 relative to the stator 32. In one implementation, the stator 32 and the rotor 28 can be implemented as a direct current (DC) brushless motor that receives DC voltage from a vehicle battery. The amount of DC voltage applied to the stator 32 may be greater than 40 volts (V), such as can be provided by a modern 48V vehicle electrical system. Other implementations are possible in which a vehicle electrical system uses higher voltages, such as 400V and 800V. Electrical connectors 46 are included on the electrically actuated turbocharger 12 and communicate electrical power from an electrical source to a PCB that regulates electrical current supplied to the electrical motor of the electrically-actuated turbocharger 12.

A PCB housing 40 is coupled with the assembly 10. The PCB housing 40 includes a cavity 48 for receiving a PCB and a heat sink 42 that directly abuts the PCB. The heat sink 42 can be implemented in a variety of ways, such as a fluid passage 44 carrying engine oil or engine coolant that has been cooled by a radiator. The fluid can travel from the ICE through the radiator where it is cooled and on to the fluid passage 44 in the PCB housing 40. The cooled fluid can help remove heat from the PCB and electrical components carried by the PCB. It should be appreciated that in other embodiments the PCB housing 40 and heat sink can be positioned separate and away from the turbocharger assembly 10. The PCB and PCB housing 40 can be electrically connected to the electric motor via electric cabling.

The exhaust portion 22 is in fluid communication with exhaust gases generated by the ICE. As the revolutions per minute (RPMs) of the crankshaft of the ICE increase, the volume of the exhaust gas generated by the ICE increases and correspondingly increases the pressure of exhaust gas in the exhaust portion 22. This increase in pressure can also increase the angular velocity of the exhaust turbine 36 that communicates rotational motion to the compressor turbine 26 through the turbine shaft 24. In this implementation, the compressor turbine 26 receives rotational force from the exhaust turbine 36 and the electric motor 30. More particularly, when the ICE is operating at a lower RPM, the electric motor 30 can provide rotational force to the compressor turbine 26 even though exhaust gas pressure within the exhaust portion 22 is relatively low. As the ICE increases the RPM of the crankshaft, exhaust gas pressure within the exhaust portion 22 can build and provide the rotational force that drives the compressor turbine 26.

The electronics assembly 14 is coupled to the compressor portion 18 of the electrically-actuated turbocharger 12 as is shown in FIGS. 1-2. The electronics assembly 14 includes the PCB housing 40 having the heat sink 42 with the fluid passage 44, and electrical connectors 46. The PCB housing 40 is shaped so that it fits closely with or abuts the electrically-actuated turbocharger 12.

However, it should be appreciated that the concepts described herein can be applied to electrically actuated turbochargers that are configured in different ways. For example, the electrically actuated turbocharger can be implemented using a compressor portion and an electric motor portion while omitting the exhaust portion. In such an implementation, the turbocharger includes a compressor turbine coupled to the electric motor via a turbine shaft without relying on an exhaust turbine to also be coupled to the turbine shaft. This implementation can sometimes be referred to as an electric supercharger because forced induction in this implementation relies solely on the rotational force provided by an electric motor rather than also using an exhaust turbine that is rotationally driven by exhaust gases. The compressor turbine chamber 38 is in fluid communication with a compressor inlet 40 that draws air from the surrounding atmosphere and supplies it to the compressor turbine 26. As the PCB selectively provides current to the windings of the stator 32, the rotor 28 is induced to rotate and impart that rotation on the turbine shaft 24 and the compressor turbine 26.

Figure 3:
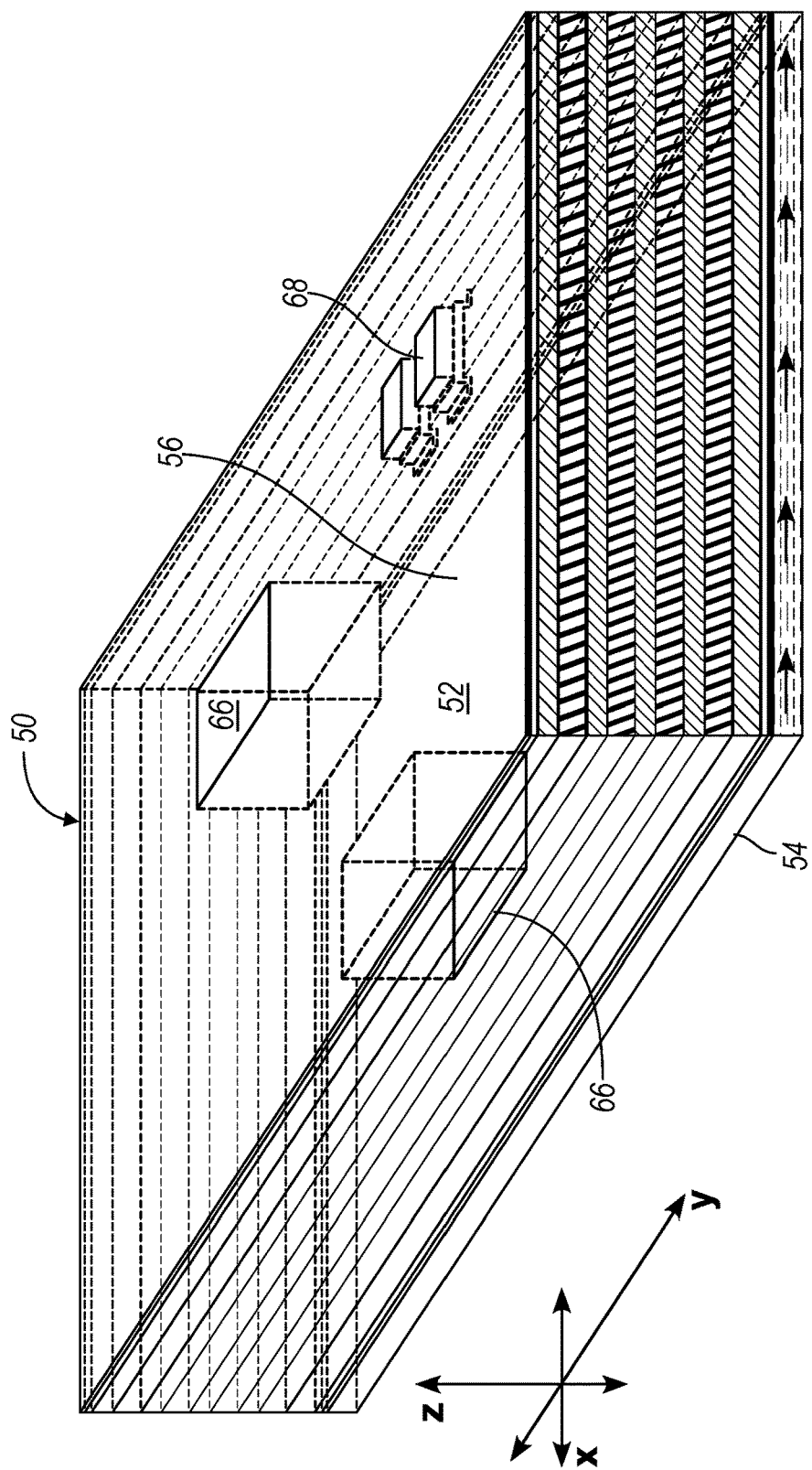
FIG. 3 is a perspective view depicting an implementation of a printed circuit board (PCB) used with an electrically-actuated turbocharger assembly.

Turning to FIG. 3, an implementation is shown of a PCB 50 having electrical components optimally arranged to provide electrical current to an electrical motor in the electrically-actuated turbocharger 12. The PCB 50 includes a first side 52 of the PCB 50 and a second, opposite side 54 of the PCB 50 along with a plurality of component layers in a stack the identity and quantity of which vary depending on the implementation. In one implementation, the PCB 50 includes, from top to bottom, an overlay 56, a solder mask 58, a conductive layer 60, and a dielectric or substrate layer 62. Additional quantities of these elements can be added to the stack depending on circuit design and/or application. One or more electrically-conductive vias 64 extend in the Z-direction and can electrically communicate or carry electrical power between two or more electrical components spaced apart in the Z-direction. The vias 64 can be blind vias, buried vias, filled vias, or through-hole vias as are known in the art. The stack or component layers have a thickness substantial or great enough so that at least some of the electrical components can be recessed within the PCB 50 such that a top surface of the components are flush with a surface of the side(s) of the substrate. The PCB 50 comprises conductive layers 60 and substrate layers 62. The composition and construction of these layers can vary. In this implementation, the dielectric substrate layers 62 can be constructed from a glass-reinforced epoxy material (FR4) and the conductive layers 60 may be formed from copper. However, it should be understood that other implementations using different substrate materials, conductive materials, quantity of conductor layers, and quantity of substrate layer are possible. The number of substrate layers and conductive layers can vary without departing from the arrangement of electrical components described herein.

A variety of electrical components can be mounted on and electrically connected to the PCB 50. In one implementation, the PCB 50 includes electrical components comprising a switching device 66, such as a power switch, as a type of electrical component that regulates the supply of electrical current to the electric motor of the electrically-actuated turbocharger 12 and is controlled by a gate driver 68. The power switch 66 can be a transistor implemented as a switch having a source, a gate, and a drain. The transistor can be a Metal Oxide Field Effect Transistor (MOSFET), a Binary Junction Transistor (BJT), or other similar transistor as is known in the art. The transistor can be leaded such that a plurality of leads extend outward and away from the body of the transistor. Or in another implementation the transistor can be leadless such that the electrical leads are implemented as electrically-conductive pads that are positioned so that they are accessible from an outer surface of the transistor. Each type of transistor can be soldered to copper pads electrically communicating with a conductive layer 60 of the PCB 50. The PCB 50 can include different quantities of power switches 66 depending on electric motor design. The PCB 50 can also use a gate driver circuit having electrical components that can include a gate driver, a plurality of resistors, and a plurality of capacitors electrically connected to each other and ultimately to the gate of the power switch 66.

Figures 4A, 4B:
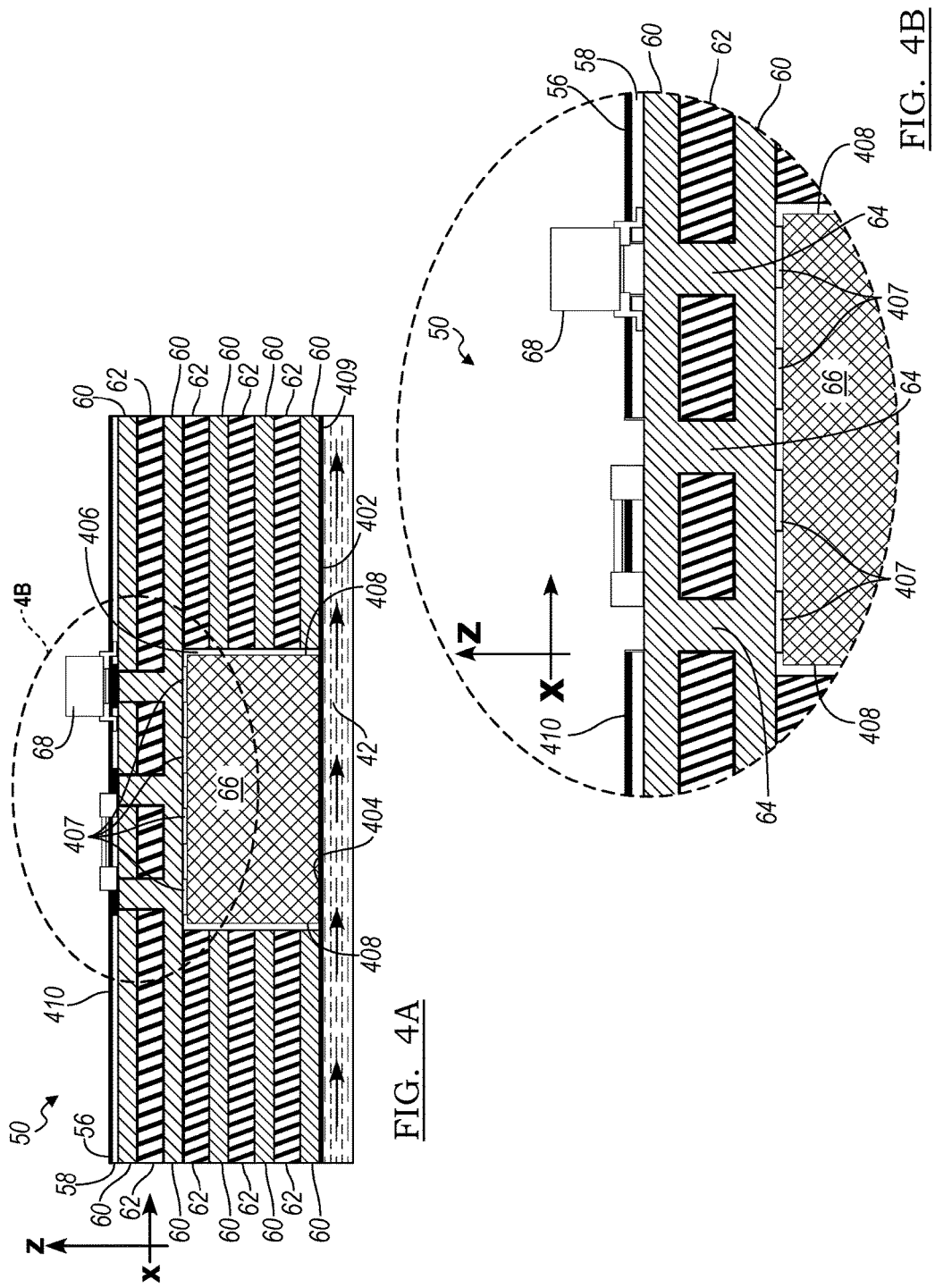
FIGS. 4(a)-4(b) cross-sectional views depicting an implementation of a PCB used with an electrically-actuated turbocharger assembly.

Turning to FIG. 4a, a cross-sectional view of a portion of one implementation of a PCB 400 having electrical components optimally arranged is shown. The PCB 400 includes the power switch 66 at least partially overlapped in the vertical or Z-direction by the gate driver 68. The power switch 66 can be located on a bottom surface 402 of the PCB 400 such that it is recessed into the PCB 400 so that a top surface 404 of the switch 66 may be flush with the bottom surface 402. To receive the power switch 66, a cavity 406 can be created by removing a plurality of conductive and substrate layers 60, 62 from a defined area that closely conforms to the outer walls 408 of the power switch 66. The power switch 66 can have a height or thickness measured in the Z-direction of approximately 20 millimeters (mm) while the solder mask 58 can be approximately 1 mm thick, the conductive layer 60 may be approximately 3 mm thick, and the substrate layer 62 can be approximately 4 mm thick. In this implementation, the power switch 66 can be a leadless transistor having copper pads 407 representing a source, a gate, a drain, and a ground positioned on a bottom surface of the switch 66. The copper pads 407 can be soldered to circuit traces included with the conductive layer 60 positioned between a top surface 410 and the bottom surface 402 of the PCB 400. The heat sink 42 can by positioned so that it separated from the bottom surface 402 of the PCB 400 as well as the top surface 404 of the power switch only by a thin dielectric layer 409, such as dielectric grease. Cooling fluid can circulate through the heat sink 42 to reduce the temperature of the power switch and carry heat away from the PCB 400.

The gate driver 68 can be mounted on the top surface 410 of the PCB 400 such that it overlaps the power switch 66 when viewed from or along the Z-direction, as is shown in FIG. 4b in more detail. The gate driver 68 can be implemented by a transistor scheme or an integrated circuit (IC) scheme, such as a power MOSFET or other gate drive IC, such as the ADuM3123 gate driver produced by Analog Devices. The gate driver 68 can have leads that extend outwardly away from the body of the transistor and are soldered to vias 64 communicating with the top surface 410 of the PCB 50. This can be referred to as a leaded implementation. But leadless implementations are possible. The vias 64 can be blind vias that electrically connect the gate driver 68 to the gate input of the power switch 66. The distance between the gate driver 68 and the gate input of the power switch 66 can be minimized due to the vertical overlap between these electrical components.

Turning to FIG. 5, a cross-sectional view of a portion of another implementation of a PCB 500 having electrical components optimally arranged is shown. The PCB 500 includes a first power switch 66 mounted on a first side 502 of the PCB 500 at least partially overlapped in the vertical or Z-direction by a second power switch 66 mounted on a second side 504 of the PCB 500. The first power switch 66 can be located on top of the first side 502 of the PCB 500 so that the top surface 404 and walls 408 of the first power switch 66 can be exposed. The second power switch 66 mounted on the second side 504 of the PCB 500 can be recessed into the PCB 500 having a top surface 404 that may be flush with the second side 504 thereby covering the walls 408 of the second power switch 66. To receive the second power switch 66, a cavity 406 can be created by removing a plurality of conductive and substrate layers 60,62 from a defined area that closely conforms to the outer walls 408 of the power switch 66.

In this implementation, the first power switch 66 and the second power switch 66 can be leadless transistors having copper pads 407 representing a source, a gate, a drain, and a ground positioned on a bottom surface of the switch 66. The copper pads can be soldered to circuit traces included with the conductive layer 60 positioned between the first side 502 and the second side 504 of the PCB 500. A first gate driver 68 can be electrically connected to the gate of the first power switch 66 while a second gate driver 68 can be electrically connected to the gate of the second power switch 66. Both the first gate driver 68 and the second gate driver 68 can be mounted on the first side of the PCB 500. The electrical connections between the gate drivers 68 and the power switches 66 can be implemented by three blind vias 64 extending the Z-direction of the PCB. The first power switch 66 and the second power switch 66 can be electrically connected to form a half-bridge circuit (or H-circuit) that can be used to alternate the polarity of voltage applied to the electric motor of the electrically actuated turbochargers 12. The heat sink 42 can be positioned so that it is in close proximity to the second side 504 of the PCB 500 as well as the top surface 404 of the second power switch 66 such that they are separated from the heat sink 42 by a thin dielectric layer 409. Cooling fluid can circulate through the heat sink 42 to reduce the temperature of the power switch 66 and carry heat away from the PCB 500.

FIG. 6 depicts a cross-sectional view of a portion of another implementation of a PCB 600 having electrical components optimally arranged. The PCB 600 can include a first gate driver 68 mounted on top of a first side 602 of the PCB 600 and a second gate driver 68 also mounted on top of the first side 602 of the PCB 600. A first power switch 66 can be mounted on a second side 604 of the PCB 600 and a second power switch 66 can also be mounted on the second side 602 of the PCB. The first gate driver 68 and the first power switch 66 are positioned so that the area of the physical structure of the driver 68 at least partially overlaps the area of the physical structure of the first power switch 66 in the vertical or Z-direction. Similarly, the second gate driver 68 and the second power switch 66 are positioned so that the area of the physical structure of the second gate driver 68 at least partially overlaps the area of the physical structure of the second power switch 66 in the vertical or Z-direction. The first power switch 66 and the second power switch 66 can be recessed into the PCB 600 having top surfaces 404 that may be flush with the second side 604 of the PCB 600 thereby covering the walls 408 of the first power switch 66 and the second power switch 66. The heat sink 42 can then be positioned so that it is in close proximity to the second side 604 of the PCB 600 and the top surfaces 404 of the first power switch 66 so that these elements are separated from the heat sink by a thin dielectric 409; the second power switch 66 as is described above.

Turning to FIG. 7, a cross-sectional view of a portion of another implementation of a PCB 700 having electrical components optimally arranged is shown. The PCB 700 includes a first power switch 66 mounted on a first side 702 of the PCB 700 at least partially overlapped in the vertical or Z-direction by a second power switch 66 mounted on a second side 704 of the PCB 700. The first power switch 66 mounted on the first side 702 of the PCB 700 can be recessed into the PCB 700 having a top surface 404 that may be flush with the first side 702 thereby covering the walls 408 of the first power switch 66. The second power switch 66 mounted on the second side 704 of the PCB 700 can also be recessed into the PCB 700 having a top surface 404 that may be flush with the second side 704 of the PCB 700 thereby covering the walls 408 of the second power switch 66. A first gate driver 68 can be mounted on the first side 702 of the PCB 700 adjacent the first power switch 66 such that the first gate driver 68 does not overlap the second power switch 66 in the z-direction. A second gate driver 68 can be mounted on the second side 704 of the PCB 700 adjacent the second power switch 66 such that the second gate driver 68 does not overlap the first power switch 66 in the Z-direction. To receive the first power switch 66, the second power switch 66, the first gate driver 68, and the second gate driver 68, cavities 406 can be created by removing a plurality of conductive and substrate layers 60, 62 from a defined area that closely conforms to the outer walls 408 of the power switches 66 as described above. In this implementation, the first power switch 66 and the second power switch 66 can be leadless transistors having copper pads 407 representing a source, a gate, a drain, and a ground positioned on a bottom surface of the switches. The copper pads 407 can be soldered to circuit traces included with a conductive layer 62 positioned between the first side 702 and the second side 704 of the PCB 700. The first gate driver 68 can be electrically connected to the gate of the first power switch 66 while the second gate driver 68 can be electrically connected to the gate of the second power switch 66. The electrical connections between the gate drivers 68 and the power switches 66 can be implemented by three blind vias 64 extending the Z-direction of the PCB 700. A first heat sink 42 can by positioned so that it is in close proximity to the first side 702 of the PCB 700 as well as the top surface 404 of the first power switch 66 separated by a thin dielectric layer 409 and a second heat sink 42 can by positioned so that it is in close proximity to the second side 704 of the PCB 700 as well as the top surface 404 of the second power switch 66 separated by another thin dielectric layer 409. This and other implementations can use dielectric grease for the dielectric layer 409 or another dielectric material with sufficient resistance to the temperatures experienced by turbochargers. Cooling fluid can circulate through the heat sink(s) 42 to reduce the temperature of the power switches 66 and carry heat away from the PCB 700.

It is to be understood that the foregoing is a description of one or more embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "e.g.," "for example," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation. Terms like "first" and "second" should be viewed interchangeably with terms such as "top" and "bottom."

What is claimed is:

1. A printed circuit board (PCB) including electrical components for controlling electrically-actuated turbochargers, comprising:
a switching device configured to be electrically connected to an electrical power source and electrically connected to an electric motor of an electrically-actuated turbocharger, wherein the switching device is physically attached to a side of the PCB within a cavity formed in the side of the PCB such that at least a portion of the switching device is below the side of the PCB.

2. The PCB recited in claim 1, wherein a gate driver is positioned on the PCB to overlap at least a portion of the switching device along the Z-axis.

3. The PCB recited in claim 1, wherein an exposed surface of the switching device contacts a heat sink or thermal grease of the heat sink.

4. The PCB recited in claim 2, wherein at least a portion of a body of the switching device coincides with a portion of a body of the gate driver along a Z-axis.

5. The PCB recited in claim 1, wherein a top surface of the switching device is substantially flush with the side of the PCB.

6. The PCB recited in claim 5, wherein the top surface of the switching device contacts a heat sink or thermal grease of the heat sink.

7. The PCB recited in claim 1, wherein a top surface of the switching device is substantially flush with the side of the PCB.

8. A printed circuit board (PCB) including electrical components for controlling electrically-actuated turbochargers, comprising:
a first switching device configured to be electrically connected to an electrical power source and electrically connected to an electric motor of an electrically-actuated turbocharger, wherein the switching device is physically attached to a first side of the PCB;
a second switching device configured to be electrically connected to the electrical power source and electrically connected to the electric motor of the electrically-actuated turbocharger, wherein the switching device is physically attached to a second side of the PCB within a cavity formed in a second side of the PCB such that at least a portion of the second switching device is below the second side of the PCB.

9. The PCB recited in claim 8, wherein the first switching device is physically attached to the first side of the PCB within a cavity formed in the first side of the PCB such that at least a portion of the first switching device is below the surface of the PCB.

10. The PCB recited in claim 8, wherein a portion of a body of a gate driver is attached to the PCB to coincide with a portion of a body of the second switching device along the Z-axis.

11. The PCB recited in claim 10, wherein at least a portion of a body of the second switching device coincides with a portion of a body of the gate driver along a Z-axis.

12. The PCB recited in claim 8, wherein a portion of a body of the first switching device is positioned on the PCB to coincide with a portion of a body of the second switching device along the Z-axis.

13. The PCB recited in claim 8, wherein an exposed surface of the second switching device contacts a heat sink or thermal grease of the heat sink.

14. The PCB recited in claim 8, wherein a top surface of the second switching device is substantially flush with the second side of the PCB.

15. The PCB recited in claim 14, wherein the top surface of the second switching device contacts a heat sink or thermal grease of the heat sink.

16. The PCB recited in claim 15, wherein a top surface of the first switching device is substantially flush with the first side of the PCB.

17. A printed circuit board (PCB) including electrical components for controlling electrically-actuated turbochargers, comprising:
- a first switching device configured to be electrically connected to an electrical power source and electrically connected to an electric motor of an electrically-actuated turbocharger, wherein the switching device is physically attached to a first side of the PCB within a first cavity formed in the first side of the PCB such that at least a portion of the first switching device is below the first side of the PCB; and
- a second switching device configured to be electrically connected to the electrical power source and electrically connected to the electric motor of the electrically-actuated turbocharger, wherein the switching device is physically attached to the first side of the PCB within a second cavity formed in the first side of the PCB such that at least a portion of the second switching device is below the first surface of the PCB.

18. The PCB recited in claim 17, wherein a portion of a body of a gate driver is positioned on the second side of the PCB to coincide with a portion of a body of the first switching device or the second switching device along the Z-axis.

19. The PCB recited in claim 17, wherein a top surface of the first switching device is substantially flush with the first side of the PCB and the second switching device is substantially flush with the second side of the PCB.

20. The PCB recited in claim 19, further comprising a first heat sink abutting the top surface of the first switching device and a second heat sink abutting the top surface of the second switching device.

* * * * *